(12) United States Patent
Tippner et al.

(10) Patent No.: US 6,175,085 B1
(45) Date of Patent: Jan. 16, 2001

(54) SOLDER MASK CONFIGURATION FOR A PRINTED WIRING BOARD WITH IMPROVED BREAKDOWN VOLTAGE PERFORMANCE

(75) Inventors: Michael P. Tippner, Cedar Knolls; Melvin Otto Wilson, Ringoes; Vlademir Yanefski, Aberdeen, all of NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/168,036

(22) Filed: Oct. 7, 1998

(51) Int. Cl.[7] .................................................. H05K 1/03
(52) U.S. Cl. .......................................... 174/255; 174/261
(58) Field of Search .................................. 174/255, 256, 174/261, 262; 361/767

(56) References Cited

U.S. PATENT DOCUMENTS

| | | | |
|---|---|---|---|
| 4,991,060 | * 2/1991 | Kawakami et al. | 361/410 |
| 5,433,822 | * 7/1995 | Mimura et al. | 156/659.1 |
| 5,665,650 | * 9/1997 | Lauffer et al. | 216/20 |
| 5,822,856 | * 10/1998 | Bhatt et al. | 29/832 |

* cited by examiner

*Primary Examiner*—Jeffrey Gaffin
*Assistant Examiner*—Jeremy Norris
(74) *Attorney, Agent, or Firm*—Darby & Darby

(57) ABSTRACT

A printed wiring board including a first solder mask covering a portion of a first conductor pad. The inner perimeter of the first solder mask extends radially inward of the outer perimeter of the first conductor pad so that a portion of the first connector pad proximate its outer perimeter is covered by the first solder mask. The inner perimeter of the first solder mask is radially outward of the inner perimeter of the first connector pad so that a portion of the first connector pad proximate the inner perimeter of the first connector pad is left exposed. In addition, the printed wiring board may include a second solder mask that covers a portion of a second connector pad. The second solder mask configured with respect to the second connector pad similar to that of the first solder mask with respect to the first connector pad. Alternatively, or in addition to the second connector pad, the printed wiring board may include a conductor path of which at least a portion is covered by a second solder mask. The outer perimeter of the second solder mask is radially outward of the outer perimeter of the conductor pad. Accordingly, the outer perimeters of the solder masks define an exposed area therebetween which is not covered by solder mask. This solder mask configuration increases the distance between exposed metal areas and the roughness of the surface of the backplane therebetween. As a result, the PWB is more resistant to voltage breakdown.

13 Claims, 4 Drawing Sheets

SOLDER MASK CONFIGURATION FOR A PRINTED WIRING BOARD WITH IMPROVED BREAKDOWN VOLTAGE PERFORMANCE

FIELD OF THE INVENTION

The present invention relates to a solder mask configuration for a printed wiring board, and in particular to a printed wiring board with a solder mask configuration that improves breakdown voltage performance and a method for manufacturing the same.

BACKGROUND OF THE INVENTION

For the purposes of the present disclosure the term "exposed" is defined with respect to an area that is substantially free from solder mask.

During the manufacture of a printed wiring board (PWB), a liquid permanent epoxy solder mask (also called "solder resist"), which remains on the board when in use, such as conformal liquid photoimageable or screen printed mask, is generally used to protect the circuitry and provide insulation. Specifically, the solder mask serves several purposes including: 1) preventing shorts during assembly; 2) preventing shorts between conductors and metal components; 3) protecting against high voltage breakdown; and 4) protecting conductors from oxidation, contamination and mechanical damage. Solder mask is typically applied to areas of the PWB between adjacent through-hole component pads, surface-mount component lands, or vias (used to connect between PWB layers), or a combination thereof, which have exposed metal lands. FIG. 1 shows two through-hole connector pads of a prior art PWB 10 with an area 13 (denoted by hatch marks) between the two connector pads that is covered with solder mask. Adjacent connector pads 12a, 12b are delimited by an inner perimeter 16a, 16b, defined by connector-pin holes 11a, 11b, respectively, and an outer perimeter 15a, 15b. The connector pads 12a, 12b are "exposed", that is, the pads are not protected or covered by solder mask. Therefore, the solder mask surrounds each connector pad, and extends between adjacent connector pads, except for a relatively narrow exposed clearance area 14a, 14b proximate the outer perimeter 15a, 15b of the respective connector pad.

In some cases the spacing "d" between exposed metal surfaces, such as connectors, is dictated by the technology chosen for the product. For example, a through-hole connector system may be selected based on cost, density and electrical performance parameters. As a result, the distance "d" between exposed metal surfaces is often fixed. Signals routed through such connectors may be exposed to relatively high transient or continuous voltages. If the distance "d" is relatively small then a relatively high voltage may result in arcing between the two adjacent exposed metal surfaces, which can destroy the solder mask and cause charring or a resistive fault, thereby rendering the PWB ineffective. Arcing may occur even with relatively small increases in voltage using this PWB configuration because of the relatively short distance "d" between the exposed metal surfaces and the relatively smooth surface of the solder mask coating of the PWB between the two exposed metal surfaces.

It is therefore desirable to improve the voltage breakdown performance by increasing the distance between exposed metal surfaces and increasing the roughness of the surface of the PWB therebetween.

In a preferred embodiment of the present invention, a printed wiring board includes a first conductor pad. The inner perimeter of the first conductor pad substantially surrounds a first hole extending through the board. A first solder mask overlies a portion of the first conductor pad and extends radially outward thereof. An inner perimeter of the first solder mask is radially inward of an outer perimeter of the first conductor pad so that a portion of the first conductor pad proximate its outer perimeter is covered by the first solder mask. Furthermore, the inner perimeter of the first solder mask is radially outward of the inner perimeter of the first conductor pad so that a portion of the first conductor pad proximate its inner perimeter is left exposed.

In addition, the printed wiring board in accordance with the present invention may include a second conductor pad disposed proximate but separate from the first conductor pad. The inner perimeter of the second conductor pad substantially surrounds a second hole extending through the board. A second solder mask overlies a portion of the second conductor pad and extends radially outward thereof. The second solder mask is arranged with its inner perimeter radially inward of the outer perimeter of the second conductor pad so that a portion of the second conductor pad proximate its outer perimeter is covered by the second solder mask. Furthermore, the inner perimeter of the second solder mask is radially outward of the inner perimeter of the second conductor pad so that a portion of the second conductor pad proximate its inner perimeter is left exposed.

In addition to, or instead of, a second conductor pad, the printed wiring board in accordance with the present invention may include a conductor path and second solder mask covering at least a portion of the conductor path so that the outer perimeter of the second solder mask extends radially outward of the outer perimeter of the conductor path. It is also noted that when the PWB includes a second conductor pad and/or conductor path the solder mask outer perimeters are separated to define an exposed area therebetween.

Furthermore, the present invention is directed to a method for manufacturing the printed wiring board described in the preceding paragraphs. A first solder mask is applied to a portion of the first conductor pad. The outer perimeter of the first solder mask extends radially outward relative to the outer perimeter of the first conductor pad, and the inner perimeter of the first solder mask extends radially outward relative to the inner perimeter of the first conductor pad. In addition, a second mask may be applied to a second conductor pad in a similar manner and/or a second solder mask may be applied to a conductor path.

BRIEF DESCRIPTION OF THE DRAWINGS

In the drawings, wherein like reference numerals delineate similar elements throughout the several views:

FIG. 3b is another embodiment of the example of the mask cutout in FIG. 3a.

DETAILED DESCRIPTION OF THE INVENTION

By way of illustrative example, the present invention is shown and described for connector pads. However, the solder mask arrangement in accordance with the present invention is suitable for any type of conductor pad, such as press-fit connector pads, vias, component pads, and surface mount pads. Furthermore, the connector pads and solder mask in accordance with the present invention are shown and described as having a substantially circular shape. It is noted, however, that other shaped conductor pads and solder masks are contemplated and within the intended scope of the invention.

The voltage breakdown performance may be improved by increasing the distance and/or roughness of the surface of the backplane between exposed metal surfaces on the PWB therebetween. As discussed above, the distance between adjacent exposed metal surfaces is often fixed based on such parameters as cost, density and electrical performance. The surface of the PWB is rougher when exposed than when it is covered by solder mask. It has therefore been recognized that the resistance to voltage breakdown may be improved by covering a portion of the exposed metal surface of the connector pad to increase the distance between exposed metal surfaces, and by reducing the area covered by solder mask between adjacent connector pads, thereby increasing the roughness of the substrate surface of the backplane.

Figure 2:
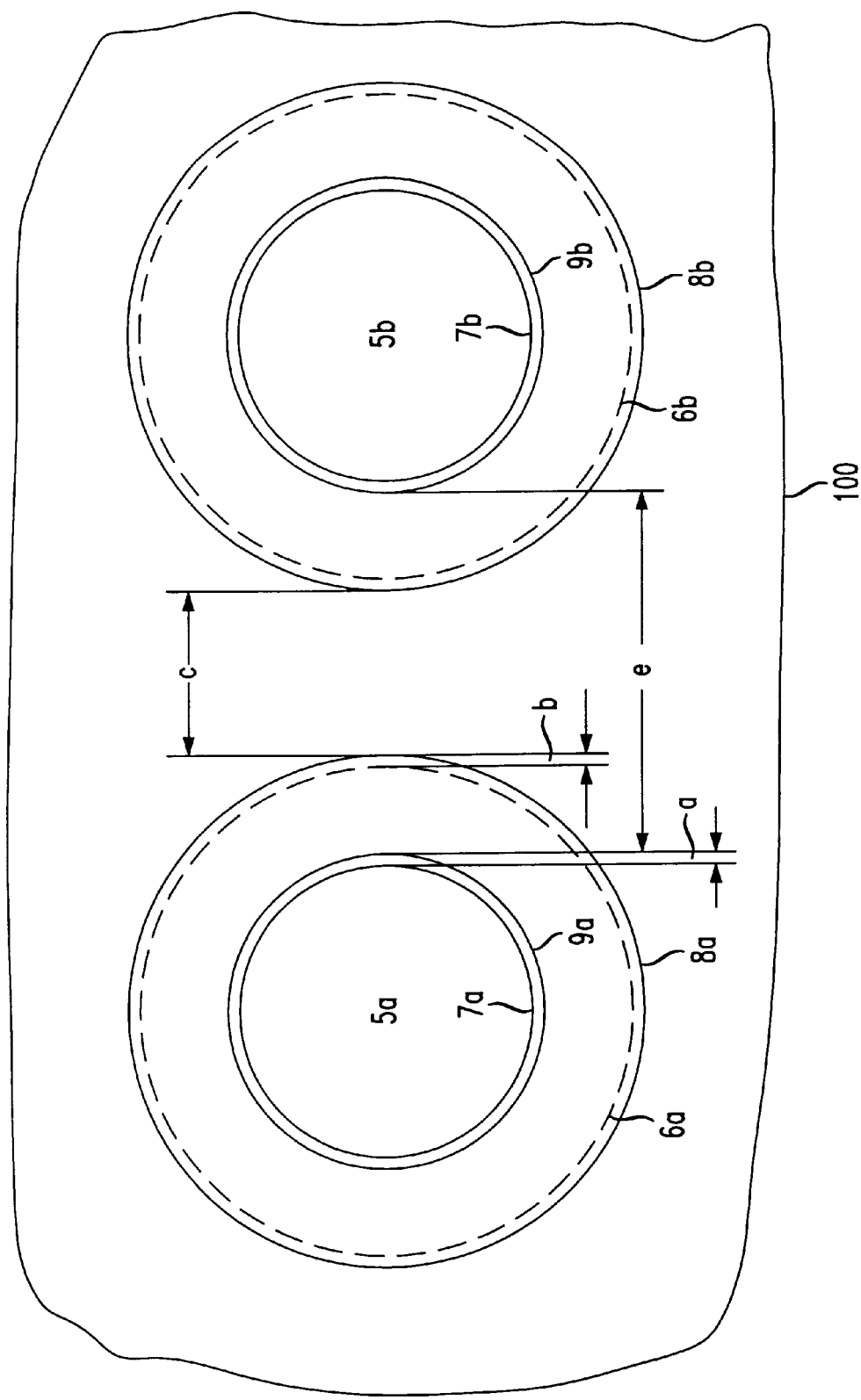
FIG. 2 is an example of the solder mask configuration for a PWB in accordance with the present invention, with the solder mask covering a portion of each of the connector pads and the area disposed between the connector pads left exposed.

FIG. 2 shows an example of a portion of a PWB 100 for press-fit connectors in accordance with the present invention including two connector pads. The first connector pad is delimited by an outer perimeter 6a and an inner perimeter 7a, while the second connector pad is delimited by an outer perimeter 6b and an inner perimeter 7b. Each pad has a respective connector-pin hole 5a, 5b defined through the board. The inner perimeter 7a, 7b, of each connector pad substantially surrounds the respective connector-pin holes 5a, 5b. A portion of each pad is covered by solder mask. Specifically, the solder mask covers a portion of each connector pad and is delimited by an outer perimeter 8a, 8b and an inner perimeter 9a, 9b, respectively.

In the preferred embodiment shown in FIG. 2, to ensure that the outer perimeter of each connector pad is covered by the solder mask, the outer perimeter 8a, 8b of the solder mask preferably is radially outward of the outer perimeter 6a, 6b, respectively, of each connector pad. In addition, the inner perimeter 9a, 9b of each solder mask preferably is radially outward of the inner perimeters 7a, 7b, respectively, of the connector pads. As a result, a portion of each connector pad proximate its inner perimeter 7a, 7b is left exposed.

Specifically, the inner perimeter 7a, 7b of each connector pad and the inner perimeter 9a, 9b of its respective solder mask are separated by a distance "a". In a preferred embodiment the distance "a" is large enough to ensure that the connector-pin holes 5a, 5b remain substantially free of solder mask when the pins of the component are inserted into the holes. The center-to-center distance between connector-pin holes of adjacent connector pads is fixed.

Figure 1:
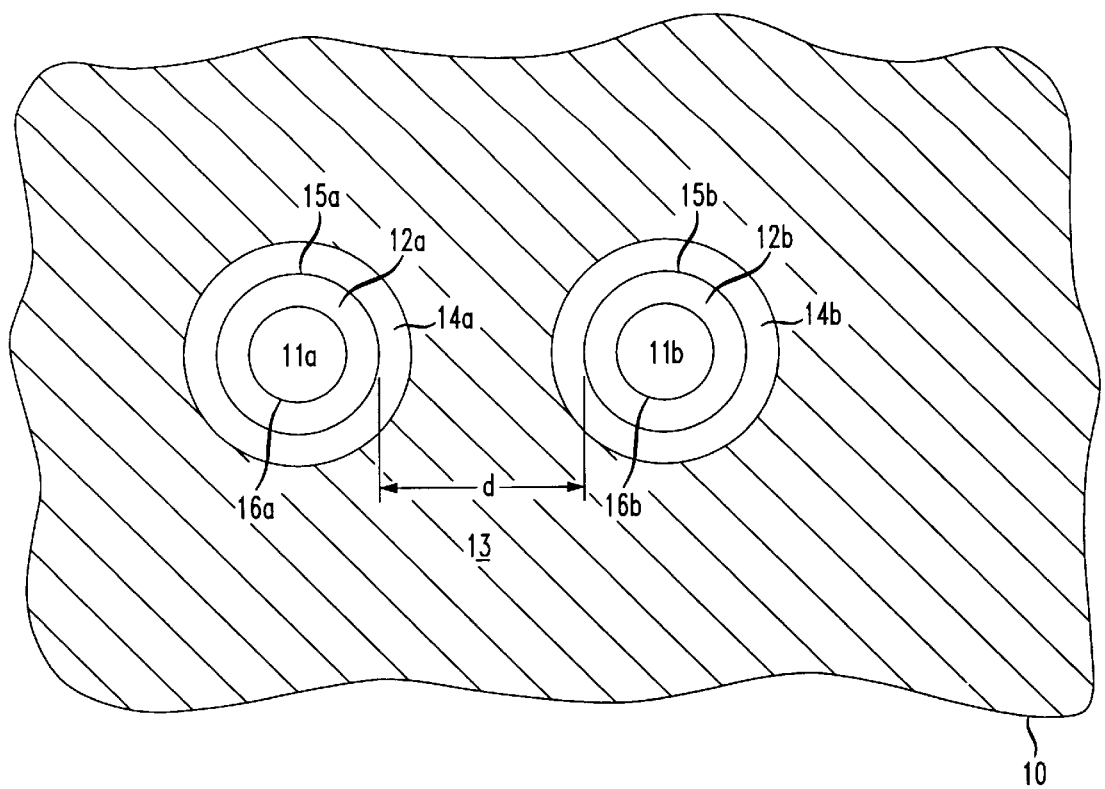
FIG. 1 is a portion of a prior art printed wiring board including two adjacent exposed connector pads with solder mask covering the area between the pads.

To optimize the resistance of the PWB to breakdown voltage two competing requirements must be balanced. First, the outer perimeters 8a, 8b of the solder mask of adjacent connector pads are preferably separated by a maximum distance "c" thereby leaving exposed as large an area as possible of the PWB between adjacent connector pads. In addition, the distance "b" between the outer perimeter 6a, 6b of each connector pad and the outer perimeter 8a, 8b of its respective solder mask is large enough such that the solder mask covers the outer perimeter of each connector pad. Since a portion of each connector pad is covered by solder mask in the PWB configuration in accordance with the present invention, the distance between adjacent exposed metal surfaces is greater than in the conventional arrangement, in which the connector pads are completely exposed. In particular, the distance "e" between adjacent exposed metal surfaces in FIG. 2 is greater than the distance "d" between adjacent exposed metal surfaces in FIG. 1 in accordance with the conventional arrangement.

Furthermore, since a greater area between adjacent connector pads is exposed, in that it is not covered by solder mask, the substrate surface of the backplane therebetween is rougher than when it is coated with solder mask. A rougher surface increases the creepage distance through which the electrical current must pass between the two exposed metal surfaces, thereby improving the voltage breakdown performance.

As an example, for a commercially available connector system with a pin-field spacing of approximately 2 mm between pin centers and a selected pad diameter of approximately 50 mils (0.050 inch), for each connector pad the distance "a" between the inner perimeters of the pad and the solder mask may be between approximately 1 mil (0.001 inch) and approximately 9 mils (0.009 inch) while the distance "b" between the outer perimeters of the pad and the solder mask may be up to approximately 8 mils (0.008 inch). For this example, the resulting distance "c" between the outer perimeters of solder mask overlays of adjacent connector pads is therefore approximately 21 mils (0.021 inch).

Not every pin on the PWB requires a relatively high breakdown voltage performance. This characteristic is desirable for pins connected to outside external leads because of the potential for voltage surges. For example, the present inventive solder mask configuration is suitable for composite clock, digital signal crossconnect level 1 (DSX1), office alarm, test access path, and operations interface telecommunication signals.

Figure 3A:
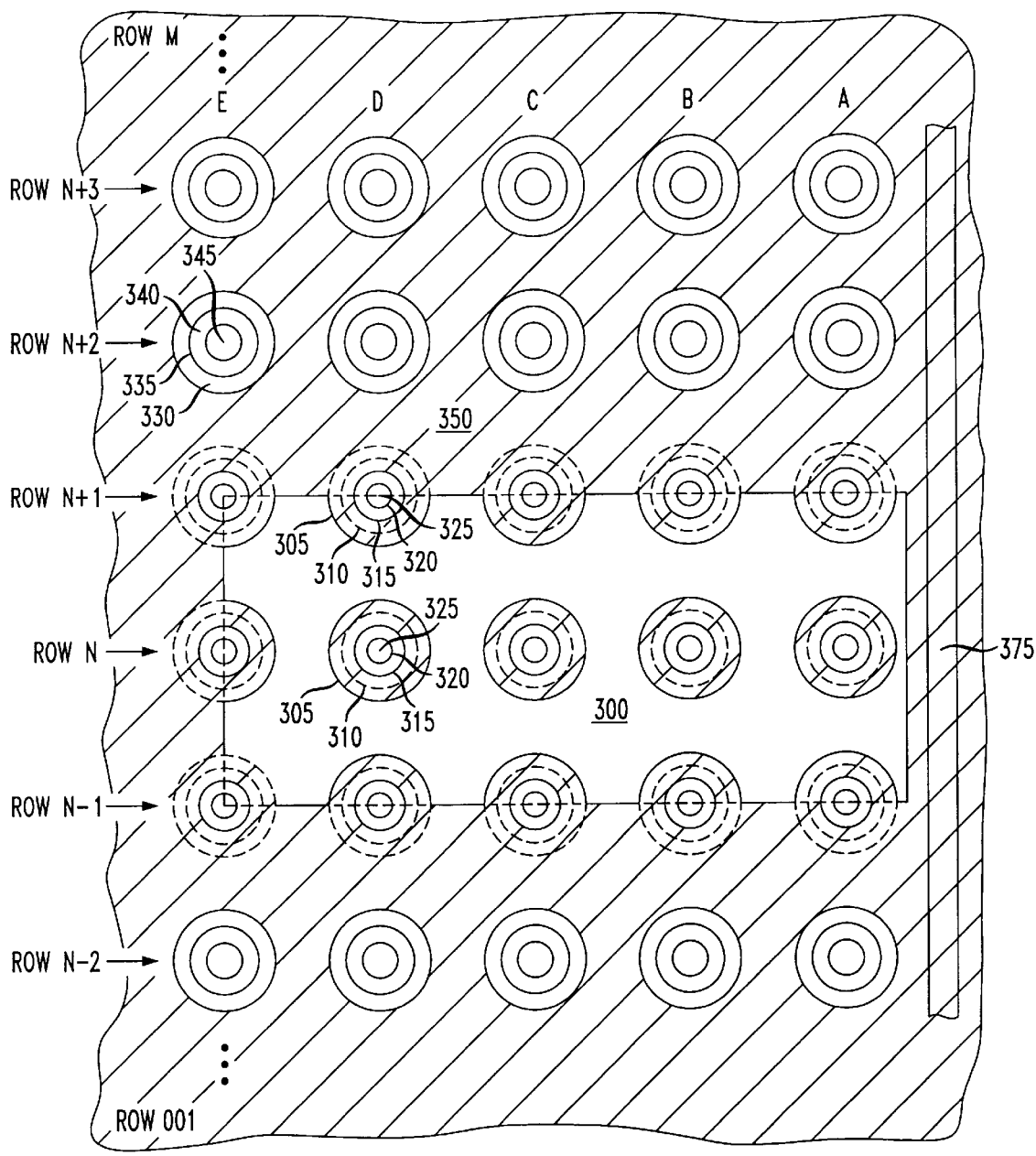
FIG. 3a is an example of a mask cutout in accordance with the present invention, with the solder mask configuration of FIG. 2 for a connector pin field with four pins that require increased robustness against breakdown voltage.
Figure 3B:
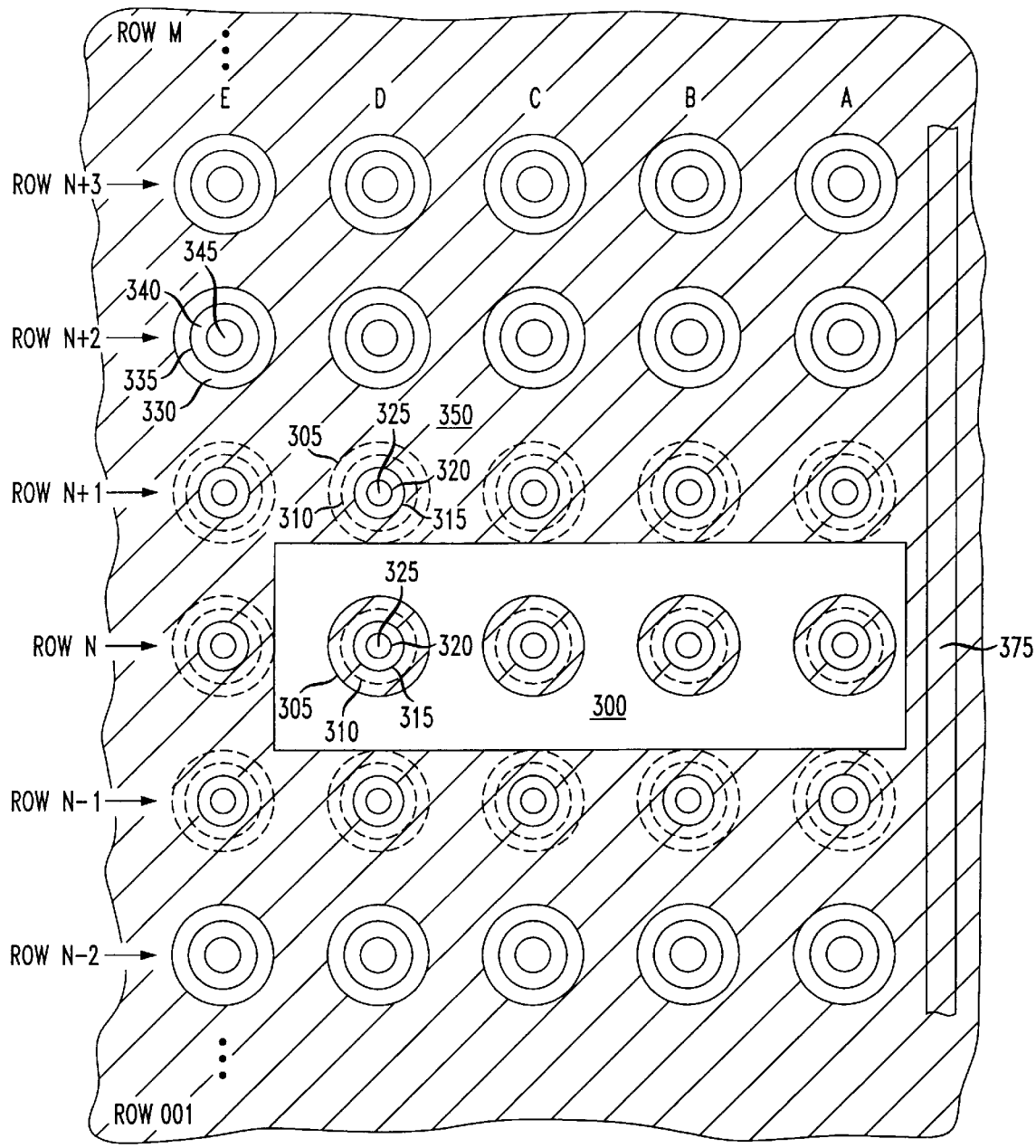

Application of the present inventive solder mask feature is shown and described, by way of example, for a connector pin field with four pins that require increased robustness against breakdown voltage. In describing this example, the signals requiring increased robustness will be referred to as "external local" signals. It is desirable to improve the breakdown resistance of these four pins using the present inventive technique because they are connected to external local leads and are therefore subject to potential voltage surges. A portion of the PWB surrounding the four pins of interest is shown in FIGS. 3a and 3b. The connector pin field has M rows and six columns (labeled A through E) of pins.

FIG. 3a is a first embodiment in which the solder mask feature in accordance with the present invention is applied to pins A, B, C, D of row N to improve their voltage breakdown performance. Even though only four external local pins A, B, C, D, of row N are of interest, in addition to these pins, the inventive solder mask configuration is applied to the 11 connector pads (pins A, B, C, D, E of rows N+1 and N−1, and pin E of row N) proximate to the four external local pins for a total of 15 pins. Thus, each of the 15 pins will be covered with solder mask as shown in FIG. 2. Consequently, the four connector pads of interest exhibit greater resistance to voltage breakdown because of the increased distance between the exposed metal surfaces between the four connector pads of interest and each of the 11 adjacent connector pads and the exposed surface of the backplane at least along a closest path therebetween.

Each of the four external local connector pads A, B, C, D of row N are configured in accordance with FIG. 2. For example, connector pad D of row N is delimited by an outer perimeter 310 and an inner perimeter 320 defined by the connector-pin hole 325. The solder mask delimited by an outer perimeter 305 and an inner perimeter 315 covers a portion of connector pad D of row N, while an area of the connector pad proximate its inner perimeter 320 is left exposed. The solder mask is applied to each of the 11 adjacent connector pads (pins A, B, C, D, E of rows N+1 and N−1, and pin E or row N) in a similar arrangement, except that in the area 350 extending outwardly from the rectangular exposed area 300, the region between adjacent connector pads is covered by the solder mask. It is not necessary to extend the inventive solder mask configuration outwardly beyond the rectangular exposed PWB area 300 since arcing will occur, if at all, between portions of the 11 adjacent connector pads closest to the 4 external local connector pads.

In the embodiment shown in FIG. 3a the solder mask is applied to the connector pads adjacent to the connector pads of interest using a single technique or method. Alternatively, however, the solder mask may be applied to the connector pads adjacent to the connector pads of interest using a hybrid configuration. The solder mask may be applied in accordance with the present invention to that portion of each of the 11 adjacent connector pads which is inside the rectangular area 300, while the solder mask may be applied to the remaining portion of each of the 11 adjacent connector pads which is outside of the area 300 in a conventional manner, such as that shown in FIG. 1. For example, the solder mask may be applied to the lower hemisphere of the connector pad located at column D of row N+1, which lies within the area 300, in accordance with the present invention. Specifically, the solder mask extends radially outward beyond the outer perimeter of the lower half of the connector pad and covers a portion thereof so that an area of the lower half of the connector pad proximate its inner perimeter is left exposed. In this hybrid embodiment, the solder mask may be applied to the upper half of the same connector pad, which is outside of the area 300, in accordance with the conventional configuration shown in FIG. 1. Specifically, the upper half of the connector pad is left exposed and a relatively narrow region is defined between its outer perimeter and the surrounding solder mask. Accordingly, the other connector pads adjacent to the connector pads of interest may be configured in a similar manner. In summary, it is only necessary that the solder mask be applied in accordance with the present invention to that portion of the adjacent connector pads which is closest to the connector pads of interest. That is, the solder mask is at least applied to an area of the adjacent connector pad which is closest to the connector pad of interest so that the solder mask covers a portion thereof, extends outward beyond the outer perimeter of the adjacent connector pad, while leaving an exposed area proximate its inner perimeter.

FIG. 3b is another embodiment of the same four external local pins of interest shown in FIG. 3a. Solder mask is applied to each of the 15 connector pads (the 4 external local pins of interest and 11 adjacent pins) using the inventive solder mask configuration shown in FIG. 2. However, instead of a portion of the 11 adjacent connector pads being located within the exposed area 300 as in FIG. 3a, in the alternative embodiment shown in FIG. 3b, the 11 adjacent connector pads lay outside of the exposed area 300 so that the overall dimensions of the exposed area is reduced. In particular, the solder mask 350 extends substantially or completely around each of the 11 adjacent connector pads, including a point on the outer perimeter 305 of the solder mask covering each of the 11 adjacent connector pads that is closest to one of the 4 external local connector pads of interest. For example, between connector pad D of row N and connector pad D of row N+1 arcing will occur, if at all, between the points along their respective outer perimeters 305 that forms the closest path therebetween. Consequently, it is only necessary to configure the solder mask so that an area is left exposed between points along the closest path between the respective outer perimeters of the solder mask of adjacent connector pads.

Referring to FIGS. 3a and 3b, because an area of the PWB is left exposed between the 4 external local connector pads and each of the 11 adjacent connector pads, the potential for arcing therebetween is reduced. Likewise, the exposed area between connector pad A of row N and the conductor path 375, which is completely covered with solder mask, increases the robustness against arcing therebetween.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

What is claimed is:

1. A printed wiring board including a substrate having a first surface and a second surface, comprising:

a first conductor pad disposed on the first surface of said substrate, said first conductor pad having an outer perimeter and an inner perimeter, the inner perimeter of said first conductor pad substantially surrounding a first hole extending through the board;

a first solder mask overlying a portion of said first conductor pad, extending radially outward thereof and having an inner perimeter radially inward of the outer perimeter of said first conductor pad so that a portion of said first conductor pad proximate its outer perimeter is covered by said first solder mask, the inner perimeter of said first solder mask being radially outward of the inner perimeter of said first conductor pad so that a portion of said first conductor pad proximate its inner perimeter is left exposed;

a second conductor pad disposed on the first surface of said substrate proximate but separated from said first conductor pad, said second conductor pad having an outer perimeter and an inner perimeter, the inner perimeter of said second conductor pad substantially surrounding a second hole extending through the board; and a second solder mask overlying a portion of said second conductor pad, extending radially outward thereof, and having an inner perimeter radially inward of the outer perimeter of said second conductor pad so that a portion of said second conductor pad proximate its outer perimeter is covered by said second solder mask, the inner perimeter of said second solder mask being radially outward of the inner perimeter of said second conductor pad so that a portion of said second conductor pad proximate its inner perimeter is left exposed, said second solder mask having an outer perimeter beyond the outer perimeter of the second conductor pad, and the outer perimeter of said first solder mask and the outer perimeter of said second solder mask are separated, to define an exposed area at least along a closest path therebetween.

2. A printed wiring board in accordance with claim 1, wherein the outer perimeter of said first solder mask and the outer perimeter of said second solder mask are separated by a distance of approximately 21 mils.

3. A printed wiring board in accordance with claim 1, wherein said conductor pads are one of vias, through-hole connector pads, surface-mount component pads, and press-fit connector pads.

4. A printed wiring board including a substrate having a first surface and a second surface, comprising:
- a first conductor pad disposed on the first surface of said substrate, said first conductor pad having an outer perimeter and an inner perimeter, the inner perimeter of said first conductor pad substantially surrounding a first hole extending through the board;
- a first solder mask overlying a portion of said first conductor pad, extending radially outward thereof and having an inner perimeter radially inward of the outer perimeter of said first conductor sad so that a portion of said first conductor pad proximate its outer perimeter is covered by said first solder mask, the inner perimeter of said first solder mask being radially outward of the inner perimeter of said first conductor pad so that a portion of said first conductor pad proximate its inner perimeter is left exposed;
- a conductor path disposed on the first surface of said substrate, said conductor path having an outer perimeter; and
- a second solder mask covering at least a portion of said conductor path and extending radially outward of the outer perimeter of said conductor path, said first solder mask having an outer perimeter beyond the outer perimeter of said first conductor pad, and said second solder mask having an outer perimeter beyond the outer perimeter of said conductor path, and the solder mask outer perimeters are separated, to define an exposed area at least along a closest path therebetween.

5. A printed wiring board including a substrate having a first surface and a second surface, comprising:
- a first conductor pad disposed on the first surface of said substrate, said first conductor pad having an outer perimeter and an inner perimeter, the inner perimeter of said first conductor pad substantially surrounding a first hole extending through the board;
- a first solder mask overlying a portion of said first conductor pad, extending radially outward thereof and having an inner perimeter radially inward of the outer perimeter of said first conductor pad so that a portion of said first conductor pad proximate its outer perimeter is covered by said first solder mask, the inner perimeter of said first solder mask being radially outward of the inner perimeter of said first conductor pad so that a portion of said first conductor pad proximate its inner perimeter is left exposed, said first solder mask having an outer perimeter radially outward of said first conductor pad;
- a second conductor pad disposed on the first surface of said substrate, said second conductor pad having an outer perimeter and an inner perimeter, the inner perimeter of said second conductor pad substantially surrounding a second hole extending through the board; and
- a second solder mask overlying at least a section of said second conductor pad which is closest to said first conductor pad, extending radially outward thereof and having an inner edge radially inward of the outer perimeter of the section of said second conductor pad so that the section of said second conductor pad proximate its outer perimeter is covered by said second solder mask, the inner edge of said second solder mask being radially outward of the inner perimeter of the section of said second conductor pad so that a portion of the section of said second conductor pad proximate its inner perimeter is left exposed, said second solder mask having an outer edge radially outward of the outer perimeter of the section of said second conductor pad, and the outer perimeter of said first solder mask and the outer edge of said second solder mask being separated from one another, to define an exposed area at least along a closest path therebetween.

6. A printed wiring board including a substrate having a first surface and a second surface, comprising:
- at least one external local conductor pad disposed on the first surface of said substrate, said at least one external local conductor pad having an inner perimeter and an outer perimeter, the inner perimeter of said at least one external local conductor pad substantially surrounding a first hole extending through the board;
- a first solder mask overlying a portion of said at least one external local conductor pad, extending radially outward thereof, and having an inner perimeter radially inward of the outer perimeter of said at least one external local conductor pad so that a portion of said at least one external local conductor pad proximate its outer perimeter is covered by said first solder mask, the inner perimeter of said first solder mask being radially outward of the inner perimeter of said at least one external local conductor pad so that a portion of said at least one external local conductor pad proximate its inner perimeter is left exposed;
- a plurality of conductor pads disposed on the first surface of said substrate proximate but separated from said at least one external local conductor pad, each of said plural proximate conductor pads having an outer perimeter and an inner perimeter, the inner perimeter f each of said plural proximate conductor pads substantially surrounding a second hole extending through the board; and
- a second solder mask overlying a portion of each of said plural proximate conductor pads, extending radially outward thereof, and having an inner perimeter radially inward of the outer perimeter of its respective plural proximate conductor pad so that a portion of each of said plural proximate conductor pads proximate its outer perimeter is covered by said second solder mask, the inner perimeter of said second solder mask being radially outward of the inner perimeter of its respective plural proximate conductor pad so that a portion of each of said plural proximate conductor pads proximate its inner perimeter is left exposed, said solder masks each having an outer perimeter beyond the outer perimeter of the respective conductor pad, the solder mask outer perimeters being separated to define an exposed area at least along a closest path therebetween.

7. A printed wire board in accordance with claim 6, wherein said conductor pads are one of vias, through-hole connector pads, surface-mount component pads, and press-fit connector pads.

8. A method for manufacturing a printed wiring board including a substrate having a first surface and a second surface, at least one external local conductor pad and a plurality of conductor pads being disposed on the first surface of said substrate, said plural conductor pads being proximate but separated from said at least one external local conductor pad, each pad having an inner perimeter and an outer perimeter, comprising the steps of:

applying a first solder mask so that it overlies a portion of the at least one external local conductor pad and extends radially outward thereof, the applied solder mask forming an inner perimeter radially inward of the outer perimeter of the at least one external local conductor pad, the inner perimeter of the first solder mask being radially outward of the inner perimeter of the at least one external local conductor pad, a portion of the at least one external local conductor pad proximate its inner perimeter being left exposed; and applying a second solder mask so that it overlies a portion of each of the plural proximate conductor pads and extends radially outward thereof, the applied second solder mask forming an inner perimeter radially inward of the outer perimeter of each respective plural proximate conductor pad, the inner perimeter of the second solder mask being radially outward of the respective inner perimeter of each respective plural proximate conductor pad, whereby a portion of each plural proximate conductor pad proximate its respective inner perimeter is left exposed, the solder masks each having an outer perimeter beyond the outer perimeter of the respective conductor pads, the solder mask outer perimeters being separated to define an exposed area at least along a closest path therebetween.

9. A method in accordance with claim 8, wherein said conductor pads are one of vias, through-hole connector pads, surface-mount component pads, and press-fit connector pads.

10. A method for manufacturing a printed wiring board including a substrate having a first surface and a second surface, at least one external local conductor pad and a plurality of conductor pads being disposed on the first surface of said substrate, said plural conductor pads being proximate but separated from said at least one external local conductor pad, each pad having an inner perimeter and an outer perimeter, comprising the steps of:

applying a first solder mask so that it overlies a portion of the at least one external local conductor pad and extends radially outward thereof, the applied solder mask forming an inner perimeter radially inward of the outer perimeter of the at least one external local conductor pad, the inner perimeter of the first solder mask being radially outward of the inner perimeter of the at least one external local conductor pad, a portion of the at least one external local conductor pad proximate its inner perimeter being left exposed; and applying a second solder mask so that it overlies at least a portion of a conductor path having an outer perimeter and extends radially outward thereof, the applied second solder mask forming an outer perimeter radially outwardly of the outer perimeter of the conductor path, whereby an exposed area is defined at least along a closest path between the solder mask outer perimeters.

11. A method for manufacturing a printed wiring board including a substrate having a first surface and a second surface, a first conductor pad and a second conductor pad being disposed on the first surface of said substrate, said second conductor pad being proximate but separated from the first conductor pad, each pad having an inner perimeter and an outer perimeter, comprising the steps of:

applying a first solder mask so that it overlies a portion of the first conductor pad and extends radially outward thereof, the applied solder mask forming an inner perimeter radially inward of the outer perimeter of the first conductor pad, the inner perimeter of the first solder mask being radially outward of the inner perimeter of the first conductor pad, a portion of the first conductor pad proximate its inner perimeter being left exposed;

applying a second solder mask so that it overlies a portion of the second conductor pad and extends radially outward thereof, the applied second solder mask forming an inner perimeter radially inward of an outer perimeter of the second conductor pad, the inner perimeter of the second solder mask being radially outward of the respective inner perimeter of the second conductor pad, a portion of the second conductor pad proximate its inner perimeter being left exposed, the solder masks each having an outer perimeter beyond the outer perimeter of the respective conductor pad, the solder mask outer perimeters being separated to define an exposed area at least along a closest path therebetween.

12. A method in accordance with claim 11, wherein said conductor pads are one of vias, through-hole connector pads, surface-mount component pads, and press-fit connector pads.

13. A method for manufacturing a printed wiring board including a substrate having a first surface and a second surface, a first conductor gad and a second conductor pad being disposed on the first surface of said substrate, said second conductor pad being proximate but separated from the first conductor pad, each pad having an inner perimeter and an outer perimeter, comprising the steps of:

applying a first solder mask so that it overlies a portion of the first conductor pad and extends radially outward thereof, the applied solder mask forming an inner perimeter radially inward of the outer perimeter of the first conductor pad, the inner perimeter of the first solder mask being radially outward of the inner perimeter of the first conductor pad, a portion of the first conductor pad proximate its inner perimeter being left exposed;

applying a second solder mask so that it overlies at least a portion of a conductor path having an outer perimeter and extends radially outward thereof, the applied second solder mask forming an outer perimeter radially outward of the outer perimeter of the conductor path to define an exposed area between the outer perimeter of the first solder mask and the outer perimeter of the second solder mask.

* * * * *